(12) United States Patent
Huang

(10) Patent No.: US 10,306,962 B2
(45) Date of Patent: Jun. 4, 2019

(54) PROTECTIVE HOUSING AND COVER MECHANISM THEREOF

(71) Applicant: NANNING FUGUI PRECISION INDUSTRIAL CO., LTD., Nanning (CN)

(72) Inventor: Ying-Jui Huang, New Taipei (TW)

(73) Assignee: NANNING FUGUI PRECISION INDUSTRIAL CO., LTD., Nanning (CN)

(*) Notice: Subject to any disclaimer, the term of this patent is extended or adjusted under 35 U.S.C. 154(b) by 273 days.

(21) Appl. No.: 15/191,852

(22) Filed: Jun. 24, 2016

(65) Prior Publication Data
US 2017/0340078 A1    Nov. 30, 2017

(30) Foreign Application Priority Data
May 24, 2016    (TW) .............................. 105116173 A (51) Int. Cl.
| | |
|---|---|
| G06F 1/16 | (2006.01) |
| A45C 11/00 | (2006.01) |
| H05K 5/06 | (2006.01) |
| H05K 5/02 | (2006.01) |
| A45C 13/00 | (2006.01) |
| H04M 1/18 | (2006.01) |

(52) U.S. Cl.
CPC ............ A45C 11/00 (2013.01); A45C 13/008 (2013.01); G06F 1/16 (2013.01); H04M 1/18 (2013.01); H05K 5/0221 (2013.01); H05K 5/061 (2013.01); *A45C 2011/002* (2013.01); *A45C 2011/003* (2013.01)

(58) Field of Classification Search
CPC ............ A45C 11/00; A45C 2011/002; A45C 2011/003; A45C 13/008; A45F 5/00; H05K 5/0221; H05K 5/0226; H05K 5/023; H05K 5/0239; H05K 5/061; H05K 5/06; B65D 53/00; G06F 1/16; G06F 1/1616; H04M 1/18
USPC ............. 220/324, 849; 361/679.55, 726, 683
See application file for complete search history.

(56) References Cited

FOREIGN PATENT DOCUMENTS

| | | | | |
|---|---|---|---|---|
| CN | 202025252 U | 11/2011 | | |
| CN | 105460372 A | 4/2016 | | |
| TW | I515154 | * | 1/2016 | ............... H05K 5/06 |

* cited by examiner

*Primary Examiner* — Fenn C Mathew
*Assistant Examiner* — Elizabeth J Volz
(74) *Attorney, Agent, or Firm* — ScienBiziP, P.C.

(57) ABSTRACT

A protective housing includes a housing and a rotating cover mechanism. An opening and a restriction groove are defined in the housing, and the cover mechanism includes a cover body and a latching member rotatably mounted on the cover body. The cover body includes an outer cover and a supporting plate detachably coupled thereto. The latching member includes a handle, a latch between the outer cover and the supporting plate and coupled to the handle, and a mechanical button adjacent to the latch. The latch includes a positioning groove. The partly exposed mechanical button is located between the outer cover and the supporting plate. The handle causes the latch to be received in the restriction groove and the mechanical button is received in the positioning groove to lock the latch.

16 Claims, 6 Drawing Sheets

PROTECTIVE HOUSING AND COVER MECHANISM THEREOF

FIELD

The subject matter herein generally relates to protecting electronic devices against dust and water.

BACKGROUND

Mobile devices, such as a notebook computer, a mobile phone, a personal digital assistant, or the like, need an enclosure to be waterproof and dustproof, and many such enclosures do not provide adequate protection against dust and water. Disclosed is a better housing and technique for sealing and protecting electronic devices from water and dust.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a region is partially contained within a boundary formed by the object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a protective housing. The protective housing comprises a housing and a cover mechanism coupled to the housing. The housing includes an opening and a restriction groove thereon, and the restriction groove is interconnected with the opening. The cover mechanism comprises a cover body. The cover body comprises an outer cover and a supporting plate detachably coupled to the outer cover and facing the opening. The latching member comprises a handle located on a side of the outer cover away from the supporting plate, a latch between the outer cover and the supporting plate and coupled to the handle, and a mechanical button positioned adjacent to the latch. The latch defines a positioning groove for accommodating the mechanical button. The mechanical button is located between the outer cover and the supporting plate, and part of the mechanical button is exposed outside from the outer cover. The handle rotates the latch and further causes the latch to be received in the restriction groove. The cover body covers the opening. The mechanical button is pushed to lock the latch.

The present disclosure describes a cover mechanism for covering an opening of the protective housing. The cover mechanism comprises a cover body. The cover body comprises an outer cover and a supporting plate detachably coupled to the outer cover and facing the opening. The latching member comprises a handle located on a side of the outer cover away from the supporting plate, a latch between the outer cover and the supporting plate and coupled to the handle, and a mechanical button positioned adjacent to the latch. The latch defines a positioning groove for accommodating the mechanical button. The mechanical button is located between the outer cover and the supporting plate, and part of the mechanical button is exposed out from the outer cover. The handle rotates the latch and further causes the latch to be received in the protective housing. The cover body covers the opening. The mechanical button is pushed into the positioning groove to lock the latch.

Figure 1:
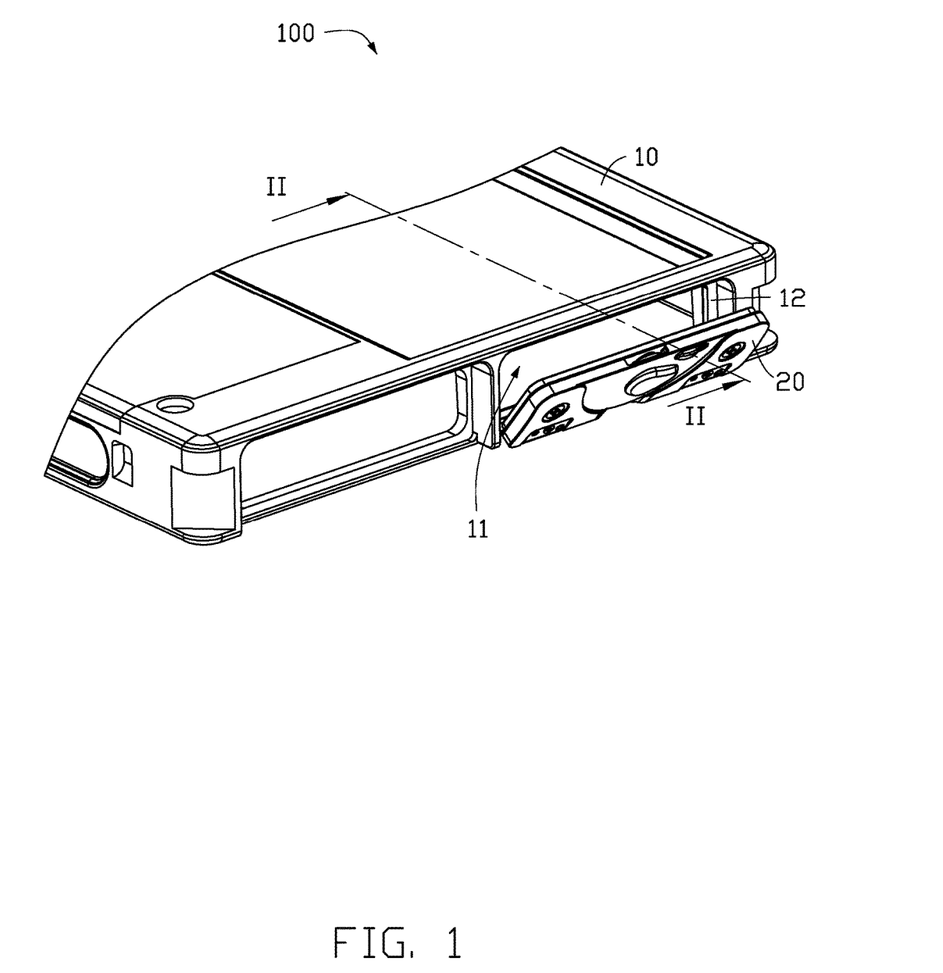
FIG. 1 is an isometric view of an exemplary embodiment of a protective housing.
Figure 2:
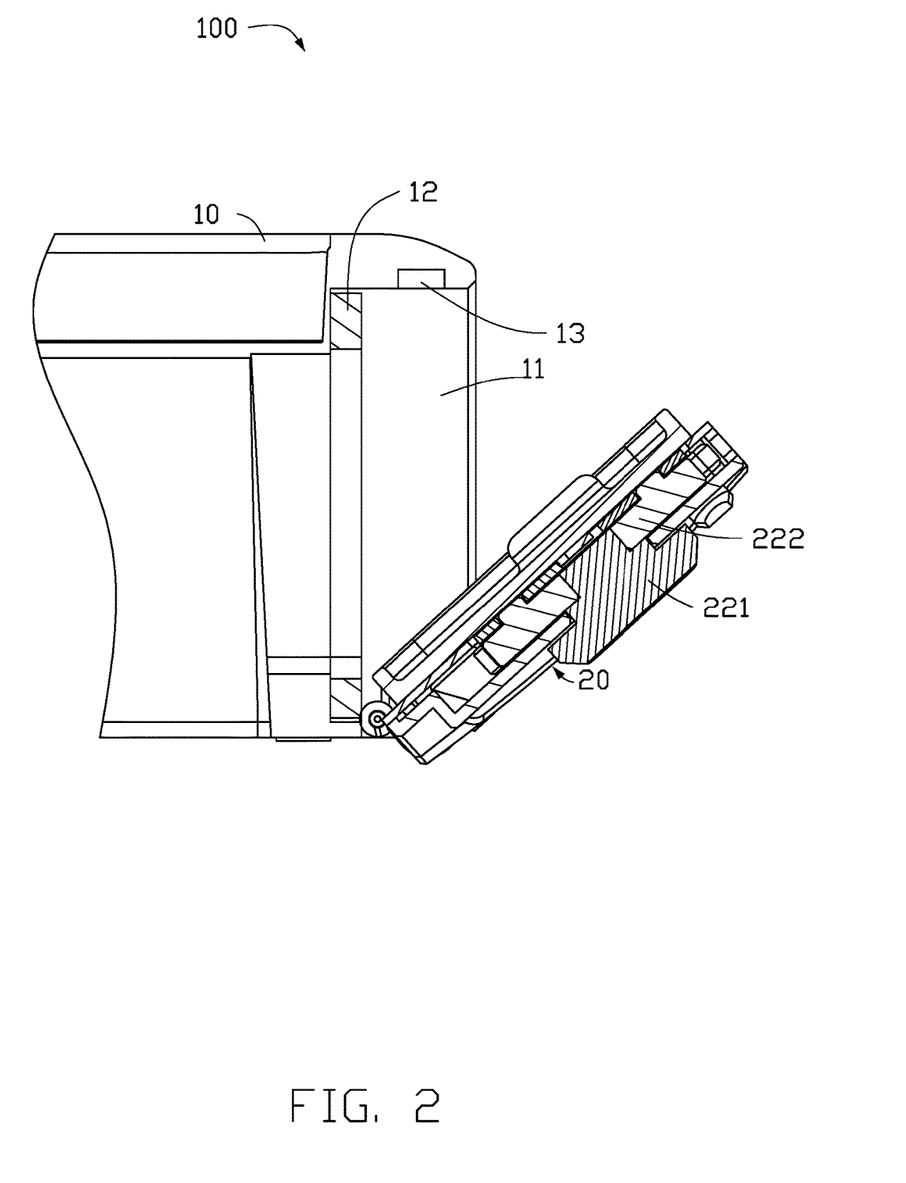
FIG. 2 is a cross sectional view of the protective housing taken along line II-II of FIG. 1.

FIGS. 1 and 2 show an exemplary embodiment of a protective housing 100. The protective housing 100 can include a housing 10 and a cover mechanism 20. The housing 10 can define an opening 11. The cover mechanism 20 can rotatably cover the opening 11. The protective housing 100 can further include a sealing ring 12 sealing a gap between the housing 10 and the cover mechanism 20. The sealing ring 12 is made of, but is not limited to, soft materials, such as plastic or silicone. As shown in FIG. 2, the housing 10 can further define a restriction groove 13 in a sidewall of the housing 10 and connected with the opening 11. The restriction groove 13 is configured to hold the cover mechanism 20. When the cover mechanism 20 covers the opening 11 and engages in the restriction groove 13, and the sealing ring 12 seals the gap between the housing 10 and the cover mechanism 20, the opening 11 of the housing 10 is sealed.

Figure 3:
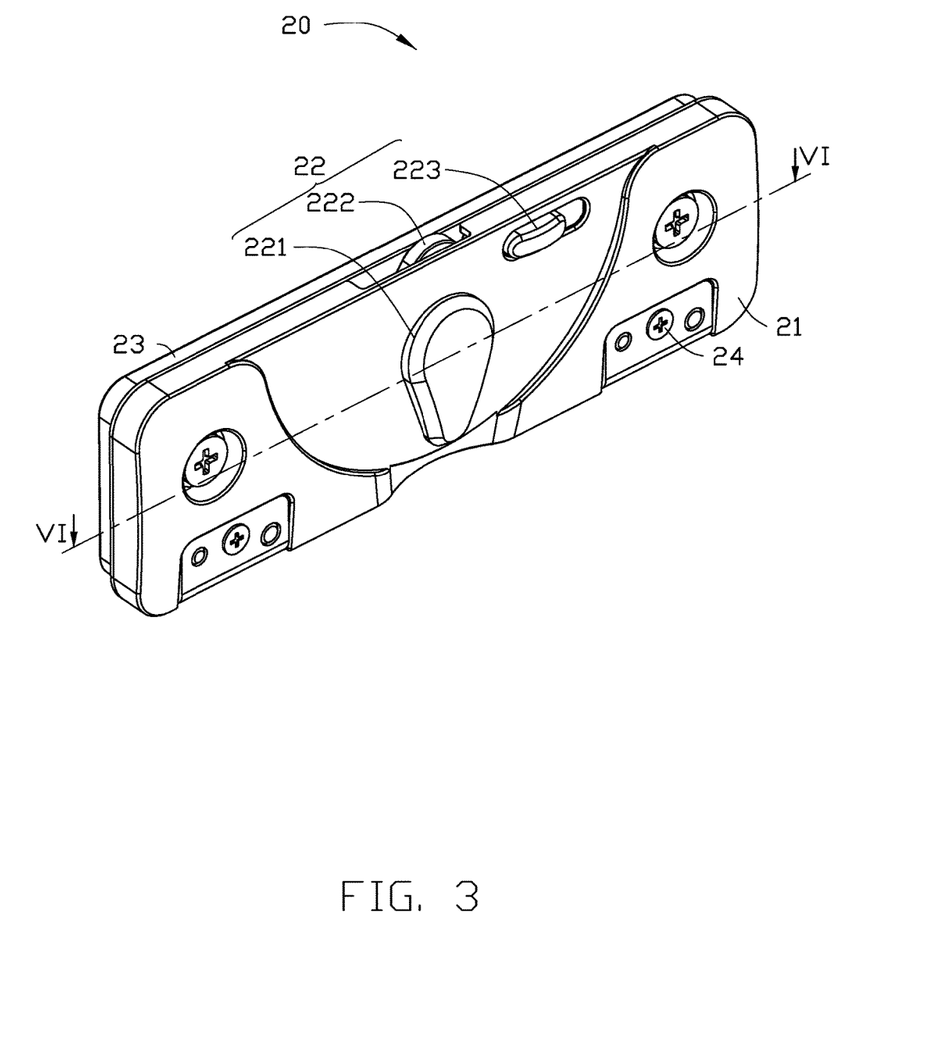
FIG. 3 is an isometric view of a cover mechanism of the protective housing shown in FIG. 1.

Referring to FIG. 3, the cover mechanism 20 can include a cover body 21, a latching member 22 located on the cover body 21, and a gate 23 rotatably coupled to the cover body 21. The cover body 21 can be rotated to cover the opening 11 (as shown in FIG. 1). The cover mechanism 20 can further include a number of pivoting members 24 locating on one side of the cover body 21 away from the gate 23. One end of each pivoting member 24 can be coupled to the cover body 21, and the other end of each pivoting member 24 can be coupled to the housing 10 (as shown in FIG. 1), such that the cover body 21 can be rotatably coupled to the housing 10. In this exemplary embodiment, the pivoting member 24 can be a hinge. The latching member 22 can include a handle 221 located on the cover body 21, a latch 222 coupled to the handle 221, and a mechanical button 223 adjacent to the latch 222. The handle 221 can be rotated by hand such that the latch 222 can be caused to rotate by the handle 221 to engage in the restriction groove 13 (as shown in FIG. 2). The mechanical button 223 can be moved along a direction toward the latch 222 such that the mechanical button 223 can abut the latch 222, the latch 222 thus being in an engagement status. The gate 23 can be movably coupled to the cover body 21. When the latch 222 gradually engages in the restriction groove 13, the latch 222 pushes an inside of the gate 23, such that the gate 23 can be squeezed into the sealing ring 12 to increase sealing. In this exemplary embodiment, the gate 23 can be a flat plate.

Figure 4:
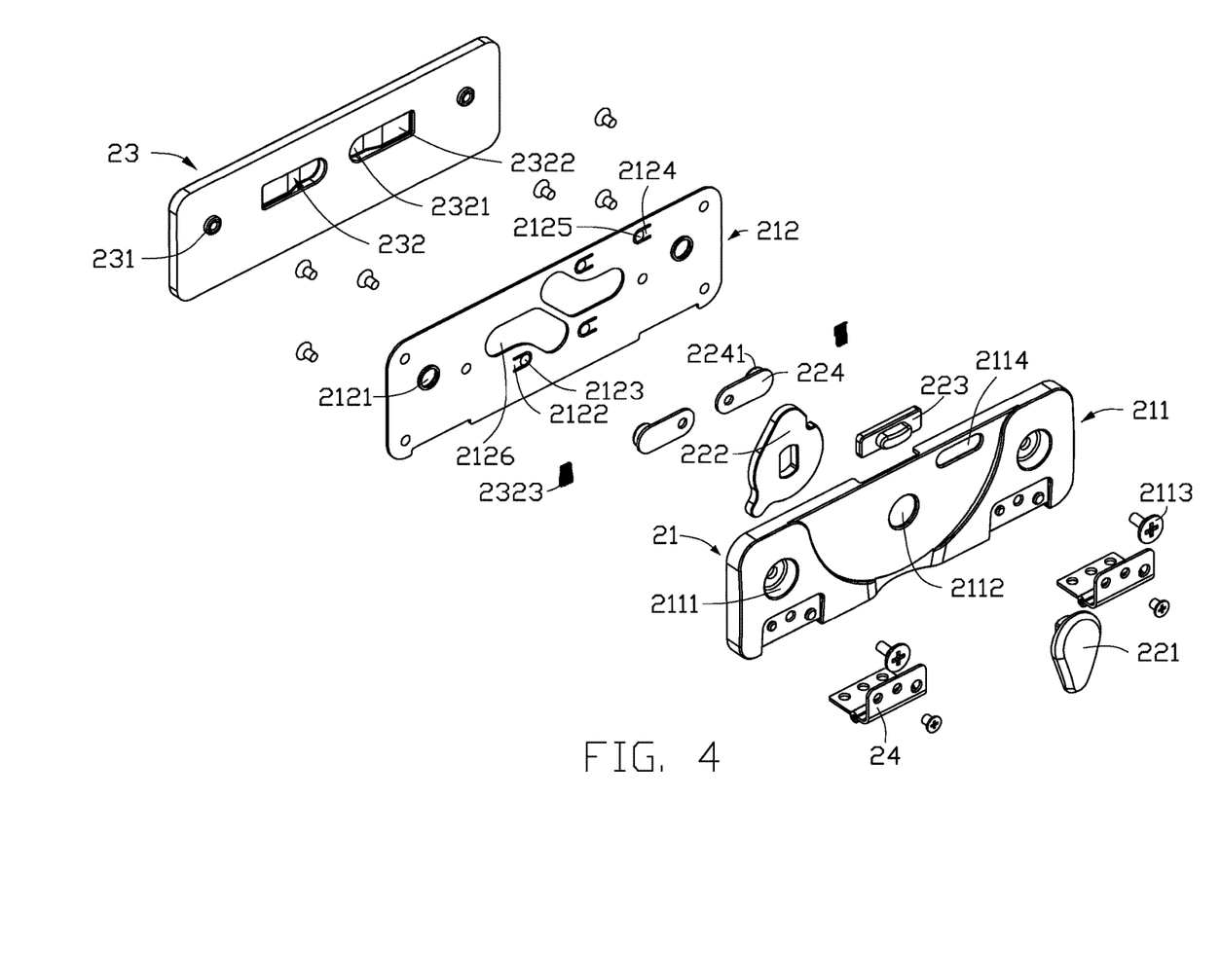
FIG. 4 is an exploded, isometric view of the cover mechanism of the protective housing shown in FIG. 1.
Figure 5:
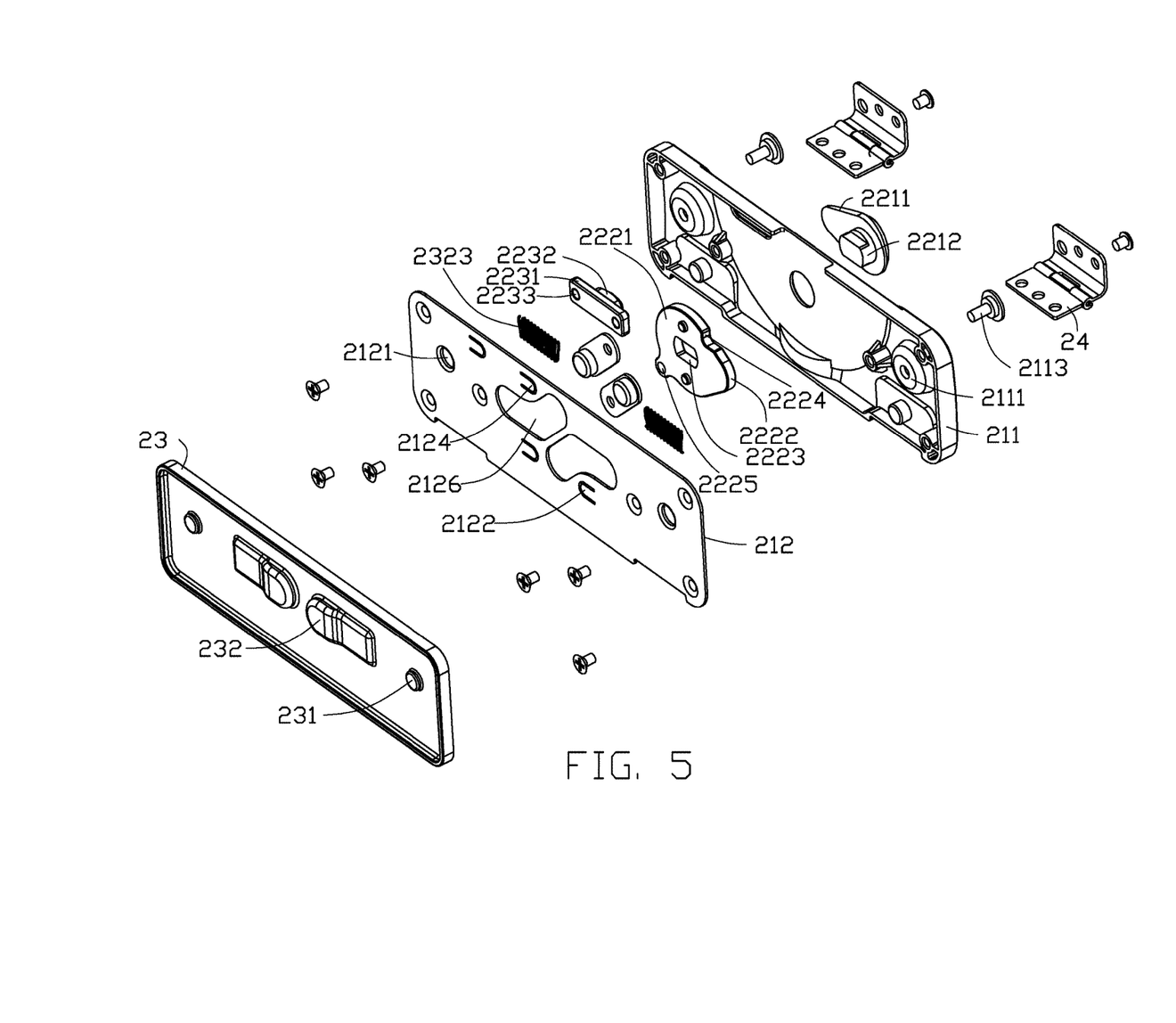
FIG. 5 is an exploded, isometric view of the cover mechanism of the protective housing shown in FIG. 1 from another view.

Referring to FIGS. 4 and 5, in this exemplary embodiment, the cover body 21 can include an outer cover 211 and a supporting plate 212. The supporting plate 212 can be detachably coupled to a side wall of the outer cover 211 facing the opening 11. Each end of the outer cover 211 defines a counterbore hole 2111. The outer cover 211 can further define a through hole 2112 between the two counterbore holes 2111. Each counterbore hole 2111 can be configured to accommodate a bolt 2113. The through hole 2112 can be configured to accommodate the handle 221. The outer cover 211 can further define a sliding groove 2114 for accommodating the mechanical button 223. The sliding groove 2114 accommodates the mechanical button 223, and further allows the mechanical button 223 to slide in the sliding groove 2114. The supporting plate 212 can define two bolt holes 2121 corresponding to the two counterbore holes 2111. Each bolt hole 2121 accommodates one bolt 2113. In this exemplary embodiment, the supporting plate 212 can be coupled to the outer cover 211. The handle 221 can be rotatably located on one side of the outer cover 211 away from the supporting plate 212. The latch 222 can be rotatably accommodated between the outer cover 211 and supporting plate 212. The handle 221 can be rotated by hand to cause the latch 222 to rotate between the outer cover 211 and the supporting plate 212. The latch 222, engaged in the restriction groove 13 (as shown in FIG. 2), is then exposed out from the outer cover 211 and the supporting plate 212. The mechanical button 223 can be accommodated between the outer cover 211 and the supporting plate 212, and part of the mechanical button 223 is exposed out from the outer cover 211 from the sliding groove 2114, such that the mechanical button 223 can be moved to slide between the outer cover 211 and the supporting plate 212.

The handle 221 can include an operation portion 2211 and a connecting portion 2212 protruding from the operation portion 2211. The operation portion 2211 can cover the outer cover 211. The connecting portion 2212 can pass through the through hole 2112.

In this exemplary embodiment, the latch 222 can be a plate which is substantially triangular in shape, and a periphery of the latch 222 can be without sharp corners. The latch 222 can include a rotating portion 2221 and an engaging portion 2222 coupled to the rotating portion 2221. The rotating portion 2221 can define a receiving hole 2223 for receiving the connecting portion 2212, such that the rotation of the handle 221 can cause the latch 222 to rotate. The engaging portion 2222 can be substantially triangular. The engaging portion 2222 can define a positioning groove 2224 for accommodating the mechanical button 223. In at least one exemplary embodiment, the latch 222 can be, but is not limited to being, a triangular plate. When the engaging portion 2222 is engaged in the restriction groove 13, the mechanical button 223 can be moved to be received in the positioning groove 2224 such that the latch 222 can be engaged. When the engaging portion 2222 is disengaged from the restriction groove 13, the mechanical button 223 can be moved away from the positioning groove 2224 to disengage from the latch 222 such that unintended openings of the cover mechanism 20 can be avoided. Moreover, the rotating portion 2221 can define a first restriction groove 2225 on a bottom surface close to the supporting plate 212.

The supporting plate 212 can include a number of first elastic plates 2122. The number of first elastic plates 2122 can be spaced from each other and arranged along a straight line. Each first elastic plate 2122 can have a first positioning protrusion 2123. In an initial state, the cover mechanism 20 can be open. The first positioning protrusion 2123 of each first elastic plate 2122 can engage in the first restriction groove 2225 of the rotating portion 2221, and the engaging portion 2222 thus cannot engage in the restriction groove 13. When the engaging portion 2222 is rotated to engage in the restriction groove 13, the first positioning protrusion 2123 of the other first elastic plate 2122 can engage in the first restriction groove 2225, such that an engagement position of latch 222 can be positioned at a same location.

The mechanical button 223 can be T-shaped. The mechanical button 223 can include a sliding portion 2231 received in the sliding groove 2114 and a striking portion 2232 protruding from the sliding groove 2114 and coupled to the sliding portion 2231. The sliding portion 2231 can define a second restriction groove 2233 on a bottom surface thereof close to the supporting plate 212. The supporting plate 212 can include a number of second elastic plates 2124. The number of second elastic plates 2124 can be spaced from each other and arranged along a straight line. Each second elastic plate 2124 can have a second positioning protrusion 2125. In the initial state, the sliding portion 2231 can be located on one end of the sliding groove 2114 spaced apart from the latch 222. The second positioning protrusion 2125 of one second elastic plate 2124 can engage in the second restriction groove 2233, and the striking portion 2232 can be moved such that the mechanical button 223 can be caused to engage with latch 222, to lock the latch 222. When the sliding portion 2231 is received in the positioning groove 2224, the second positioning protrusion 2125 of the other second elastic plate 2124 is engaged in the second restriction groove 2233, to position the mechanical button 223, and a length of the mechanical button 223 engaging in the positioning groove 2224 can be equal in engagement.

The latching member 22 can further include at least one connecting rod 224 coupled to the latch 222. One end of the connecting rod 224 can be coupled to the rotating portion 2221 and the other end of the connecting rod 224 can have an abutting portion 2241. The supporting plate 212 can define at least one guiding hole 2126 of an L shape. The rotation of the rotating portion 2221 causes the abutting portion 2241 to slide in the guiding hole 2126. In the exemplary embodiment, the number of connecting rods 224 can be two. The two connecting rods 224 can be coupled to the two sides of the rotating portion 2221. The number of guiding holes 2126 can be two. The two connecting rods 224 can slide in the two guiding holes 2126, to strengthen and stabilize the structure of the latching member 22.

Figure 6:
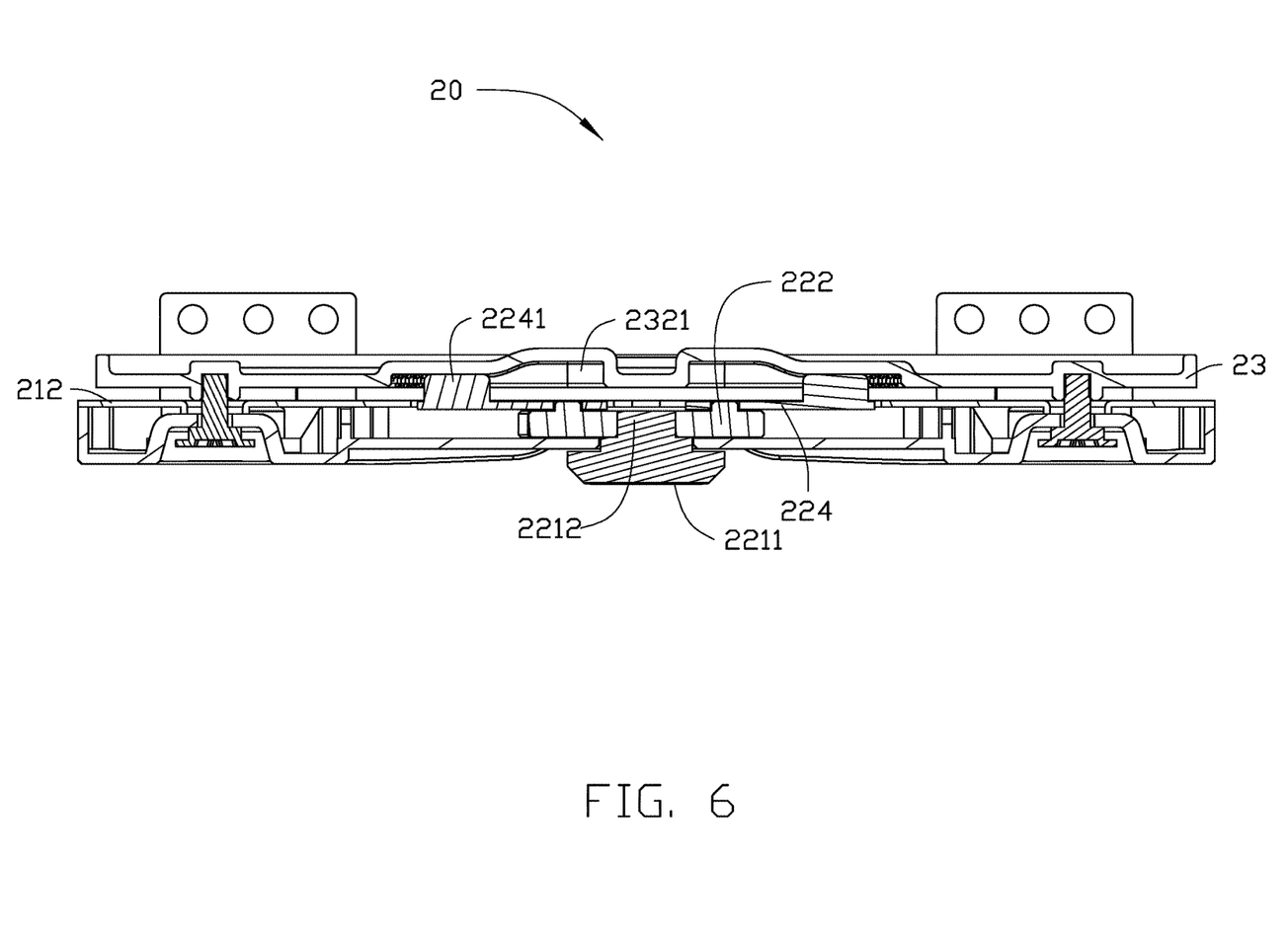
FIG. 6 is a cross sectional view of the cover mechanism taken along line VI-VI of FIG. 3.

Referring to FIGS. 4, 5, and 6, the gate 23 can define a screw hole 231 corresponding to the counterbore hole 2111. The bolt 2113 passes through the counterbore hole 2111 of the outer cover 211 and the bolt hole 2121 of the supporting plate 212, and is screwed in the screw hole 231 of the gate 23, such that the cover body 21 can be fixed to the gate 23. The gate 23 can define at least one receiving groove 232 corresponding to the guiding hole 2126. The abutting portion 2241 can pass through the guiding hole 2126 and be received in the receiving groove 232. Each receiving groove 232 can have a first groove 2321 and a second groove 2322 coupled to the first groove 2321. A depth of the first groove 2321 is greater than that of the second groove 2322. The first groove 2321 can have a smooth transition to the second groove 2322. The second groove 2322 can receive an elastic member 2323. One end of the elastic member 2323 can abut the second groove 2322, and the other end of the elastic member 2323 can abut the abutting portion 2241. In the initial state, the abutting portion 2241 can be received in the first groove 2321. The rotating portion 2221 can drive the abutting portion 2241 to slide in the guiding hole 2126, such that the abutting portion 2241 can gradually slide from the first groove 2321 to the second groove 2322. As the depth of the first groove 2321 is greater than that of the second groove 2322, the gate 23 is pushed away from the supporting plate 212 as the abutting portion 2241 slides from the first groove 2321 to the second groove 2322. In this exemplary embodiment, the number of receiving holes 232 can be two. In at least one exemplary embodiment, the number of receiving holes 232 can be two or more.

Referring to FIGS. 5 and 6, when the cover mechanism 20 is to operate, the operation portion 2211 can be rotated to cause the connecting portion 2212 to rotate and further cause the rotation of the rotating portion 2221. The rotating portion 2221 can cause the connecting rod 224 to rotate such that the abutting portion 2241 can be caused to slide along the guiding hole 2126. The abutting portion 2241 gradually slides from the first groove 2321 to the second groove 2322, such that the gate 23 moves away from the supporting plate 212. When the engaging portion 2222 is engaged in the restriction groove 13 (as shown in FIG. 2), the mechanical button 223 can be pushed to be received in the positioning groove 2224 such that the latch 222 can be locked. The gate 23 is squeezed into the sealing ring 12 (as shown in FIG. 2) by the abutting portion 2241 to increase sealing strength. When the cover mechanism 20 is to be opened, the operation portion 2211 can be rotated in opposite direction.

In at least one exemplary embodiment, the connecting rods 224 and the gate 23 can be omitted. The cover body 21 can be rotated to cover the opening 11, and the handle 221 can be rotated to cause the latch 222 to rotate, such that the latch 222 can be locked in the restriction groove 13, and the cover body 21 can be sealed.

In at least one exemplary embodiment, the elastic member 2323 can be omitted. The receiving groove 232 can receive the abutting portion 2241 of the connecting rod 224, and the latch 222 can drive the abutting portion 2241 to move reciprocally in the receiving groove 232.

The exemplary embodiments shown and described above are only examples. Many details are often found in the art such as the features of protective housing and cover mechanism thereof. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A protective housing, comprising:
   a housing defining an opening and a restriction groove thereon, and the restriction groove connected with the opening; and
   a cover mechanism coupled to the housing; the cover mechanism comprising:
   a cover body, comprising
      an outer cover; and
      a supporting plate detachably coupled to the outer cover and facing the opening, wherein the supporting plate includes at least one L-shaped guiding hole;
   a latching member comprising
      a handle located on a side of the outer cover away from the supporting plate;
      a latch located between the outer cover and the supporting plate, and coupled to the handle;
      a mechanical button positioned adjacent to the latch; and
      at least one connecting rod rotatably coupled to the latch, one end of the at least one connecting rod is rotatably coupled to the latch, and the other end of the at least one connecting rod has an abutting portion;
   wherein the latch defines a positioning groove for accommodating the mechanical button, the mechanical button locates between the outer cover and the supporting plate, and part of the mechanical button exposes out from the outer cover, a rotation of the handle causes the latch to be received in the restriction groove, the cover body covers the opening, the mechanical button receives in the positioning groove to lock the latch, a rotation of the latch causes one of the at least one abutting portion of the at least one connecting rod to slide in one of the at least one guiding hole; and
   a gate coupled to the cover body and rotatably coupled to the housing, the gate defines at least one receiving groove, each abutting portion slidably receives into one of the at least one receiving groove to abut the gate.

2. The protective housing of claim 1, wherein each receiving groove has a first groove and a second groove coupled to the first groove, a depth of the first groove is greater than that of the second groove, the supporting plate further comprises at least one elastic member received in the at least one second groove, one end of each elastic member abuts one of the at least one second groove, and the other end of each elastic member abuts one of the at least one abutting portion.

3. The protective housing of claim 1, further comprising a sealing ring sealing a gap between the housing and the cover mechanism, wherein the sealing ring is made of soft materials.

4. The protective housing of claim 1, wherein the outer cover defines a through hole, the through hole accommodates the handle, the outer cover further defines a sliding groove for accommodating the mechanical button, and the sliding groove allows the mechanical button to slide in the sliding groove.

5. The protective housing of claim 4, wherein the mechanical button comprises a sliding portion receiving in the sliding groove, and a striking portion coupled to the sliding portion and protruded from the sliding groove, the sliding portion defines a second restriction groove close to the supporting plate, the supporting plate has a plurality of second elastic plates spaced from each other, each second elastic plate has a second positioning protrusion, the second positioning protrusion of one of the plurality of second elastic plates engages in the second restriction groove.

6. The protective housing of claim 4, wherein the handle comprises an operation portion and a connecting portion protruded from the operation portion, the operation portion covers one side of the outer cover away from the supporting plate, and the connecting portion passes through the through hole.

7. The protective housing of claim 6, wherein the latch comprises a rotating portion and an engaging portion coupled to the rotating portion, the rotating portion defines a receiving hole for receiving the connecting portion of the handle, the engaging portion defines a positioning groove for accommodating the mechanical button, the engaging portion is capable of exposing out from the outer cover and the supporting plate, and receiving the restriction groove of the housing.

8. The protective housing of claim 1, wherein the latch defines a first restriction groove close to the supporting plate, the supporting plate has a plurality of first elastic plates spaced from each other, each first elastic plate has a first positioning protrusion, the latch rotates to cause the first positioning protrusion to receive in the first restriction groove.

9. The protective housing of claim 1, wherein the cover mechanism further comprises a plurality of pivoting members locating on the cover body away from the gate, one end of each pivoting member couples to the cover body, and the other end of each pivoting member couples to the housing, such that the cover body is rotatably coupled to the housing.

10. A cover mechanism, for covering an opening of the protective housing, the cover mechanism comprising:
   a cover body, comprising
      an outer cover; and
      a supporting plate detachably coupled to the outer cover and facing the opening, wherein the supporting plate defines at least one L-shaped guiding hole;
   a latching member comprising
      a handle located on a side of the outer cover away from the supporting plate;
      a latch located between the outer cover and the supporting plate, and coupled to the handle;
      a mechanical button adjacent to the latch; and
      at least one connecting rod rotatably coupled to the latch, one end of the at least one connecting rod is rotatably coupled to the latch, and the other end of the at least one connecting rod has an abutting portion;
   wherein the latch defines a positioning groove for accommodating the mechanical button, the mechanical button slidably locates between the outer cover and the supporting plate, and part of the mechanical button exposes out from the outer cover, a rotation of the handle causes the latch to be received in the protective housing, the cover body covers the opening, the mechanical button receives in the positioning groove to lock the latch, a rotation of the latch causes one of the at least one abutting portion of the at least one connecting rod to slide in one of the at least one guiding hole; and
   a gate coupled to the cover body, the gate defines at least one receiving groove, each abutting portion slidably receives in one of the at least one receiving groove to abut the gate.

11. The cover mechanism of claim 10, wherein each receiving groove has a first groove and a second groove coupled to the first groove, a depth of the first groove is greater than that of the second groove, the supporting plate further comprises at least one elastic member received in the at least one second groove, one end of each elastic member abuts one of the at least one second groove, and the other end of each elastic member abuts one of the at least one abutting portion.

12. The cover mechanism of claim 10, wherein the outer cover defines a through hole, the through hole accommodates the handle, the outer cover further defines a sliding groove for accommodating the mechanical button, and the sliding groove allows the mechanical button to slide in the sliding groove.

13. The cover mechanism of claim 12, wherein the mechanical button comprises a sliding portion receiving in the sliding groove, and a striking portion coupled to the sliding portion and protruded from the sliding groove, the sliding portion defines a second restriction groove close to the supporting plate, the supporting plate has a plurality of second elastic plates spaced from each other, each second elastic plate has a second positioning protrusion, the second positioning protrusion of one of the plurality of second elastic plates engages in the second restriction groove.

14. The cover mechanism of claim 12, wherein the handle comprises an operation portion and a connecting portion protruded from the operation portion, the operation portion covers one side of the outer cover away from the supporting plate, and the connecting portion passes through the through hole.

15. The cover mechanism of claim 14, wherein the latch comprises a rotating portion and an engaging portion coupled to the rotating portion, the rotating portion defines a receiving hole for receiving the connecting portion of the handle, the engaging portion defines a positioning groove for accommodating the mechanical button, the engaging portion is capable of exposing out from the outer cover and the supporting plate, and receiving in the restriction groove of the protective housing.

16. The cover mechanism of claim 10, wherein the latch defines a first restriction groove close to the supporting plate, the supporting plate has a plurality of first elastic plates spaced from each other, each first elastic plate has a first positioning protrusion, the latch rotates to cause the first positioning protrusion to receive in the first restriction groove.

* * * * *